United States Patent [19]

Suzuki

[11] Patent Number: 5,070,411
[45] Date of Patent: Dec. 3, 1991

[54] COLOR IMAGE RECORDING APPARATUS USING MASKS FOR FORMING LATENT IMAGES ON PHOTOSENSITIVE RECORDING MEDIUM WITH DETECTION AND CONTROL OF COLOR-SEPARATED LIGHT COMPONENTS

[75] Inventor: Makoto Suzuki, Nagoya, Japan

[73] Assignee: Brother Kogyo Kabushiki Kaisha, Japan

[21] Appl. No.: 584,657

[22] Filed: Sep. 19, 1990

[30] Foreign Application Priority Data

Sep. 19, 1989 [JP] Japan .................................. 1-243194
Nov. 28, 1989 [JP] Japan .................................. 1-308300

[51] Int. Cl.$^5$ ..................... H04N 1/23; H04N 1/46; G03B 27/10; G03B 27/73
[52] U.S. Cl. ..................... 358/302; 358/300; 358/75; 346/107 R; 346/160; 355/37; 355/38; 355/40; 355/83; 355/84; 355/88; 250/205
[58] Field of Search .................. 358/300, 302, 75; 346/107 R, 108, 110 R, 153.1, 160, 160.1, 157; 355/32, 35, 37, 38, 40, 83, 84, 88, 69–70; 250/204, 205

[56] References Cited

U.S. PATENT DOCUMENTS

| | | | |
|---|---|---|---|
| 3,898,006 | 8/1975 | Kimura | 355/69 |
| 4,082,443 | 4/1978 | Draugelis | 355/69 |
| 4,172,659 | 10/1979 | Laska | 355/38 |
| 4,344,708 | 8/1982 | Tokuda | 355/35 |
| 4,647,182 | 3/1987 | Pierce | 355/32 |
| 4,772,922 | 9/1988 | Kawahara | 355/32 |
| 4,782,352 | 11/1988 | Misono | 346/160.1 |
| 4,945,222 | 7/1990 | Sakai et al. | 250/205 |

*Primary Examiner*—Benjamin R. Fuller
*Assistant Examiner*—Scott A. Rogers
*Attorney, Agent, or Firm*—Oliff & Berridge

[57] ABSTRACT

An image recording apparatus in which a color image of an original document is copied on a sheet of paper using a photosensitive recording medium and three mask members corresponding to red, green and blue color components. The mask members have light shielding images corresponding to color-separated images of the original document. The mask member is superposed on the photosensitive recording medium and the latter is exposed to the color-separated light component through the mask member. To provide a background-white color copies, detected is a transmission rate of the color-separated light component transmitting through the mask member and an amount of the color-separated light component applied through the mask member to the photosensitive recording medium is controlled in response to the detected transmission rate.

14 Claims, 5 Drawing Sheets

COLOR IMAGE RECORDING APPARATUS USING MASKS FOR FORMING LATENT IMAGES ON PHOTOSENSITIVE RECORDING MEDIUM WITH DETECTION AND CONTROL OF COLOR-SEPARATED LIGHT COMPONENTS

BACKGROUND OF THE INVENTION

The present invention relates to an image recording apparatus in which an image exposure is performed on a photosensitive recording medium using mask members.

Conventionally, there has been known a color image recording apparatus of the type in which color separated mask members corresponding to red (R), green (G) and blue (B) color components are used to superposedly form a latent image on a photosensitive recording medium. The mask members are produced on the basis of a color image of an original document so that each of the mask members has a light shielding image corresponding to one of three primary color components of the image on the original document. The mask member is superposed on the photosensitive recording medium for exposing the latter to light through the mask member. The photosensitive recording medium has a surface on which photocurable microcapsules are coated. Therefore, the microcapsules are selectively photocured corresponding to the light shielding image on the mask member, with the result that a latent image corresponding to one of the three primary colors of the original document is formed thereon. By successively performing the exposure in superposed relation using the remaining two mask members, a latent image corresponding to the color image on the original document is formed on the photosensitive recording medium.

An amount of each of red, green and blue light components applied through the mask member to the photosensitive recording medium has been set in advance or is determined as desired by a user. In this case, the exposure amount has been set under an assumption that the lights of the respective color components transmit through the non-image area of the mask member at an equal rate. That is, the exposure amount has been set assuming that the background of the mask member is white. Therefore, when the mask members of colored background are used, the background of the reproduced color copy will not be white. In addition, the image portion of the reproduced color copy will be subjected to color fogging and thus a high quality color image will not be reproduced. To correct the color tone of the color copy, it is necessary that several test copying be performed to thereby adjust the exposure amount for each color. Such test copying is time consuming and causes waste of the recording medium.

SUMMARY OF THE INVENTION

The present invention has been made to solve the aforementioned problems, and accordingly it is an object of the present invention to provide a color image recording apparatus capable of reproducing high fidelity color copies with a white background thereon even if mask members to be used have unequal light transmission rates with respect to the lights of three primary light components.

To achieve the above and other objects, there is provided an image recording apparatus for recording an image of an original document on a sheet of paper using a photosensitive recording medium and a plurality of mask members, each of the plurality of mask members having a light shielding image corresponding to a color-separated image of the original document comprising exposure means for exposing the photosensitive recording medium to light to form a latent image thereon, wherein the mask member is superposed on the photosensitive recording medium for exposing the photosensitive recording medium to a color-separated light component corresponding to the color-separated image formed on the mask member through the mask member, detecting means for detecting a transmission rate of the color-separated light component transmitting through the mask member and producing a detection output, and control means responsive to the detection output for controlling an amount of the color-separated light component applied through the mask member to the photosensitive recording medium.

The detecting means comprises light emitting means disposed in one side of the mask member for emitting the color-separated light component, and light receiving means disposed in another side of the mask member for receiving the color-separated light component emitted from the light emitting means and transmitted through the mask member. The detecting means may comprise light receiving means disposed to receive a color-separated light components emitted from the exposure means and transmitted through the mask member. In the latter case, since the light emitted from the exposure means is used for detecting the transmission rate of the light transmitted through the mask member and thus light emitting means can be dispensed with, the cost of the overall apparatus is reduced.

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

Figure 1:
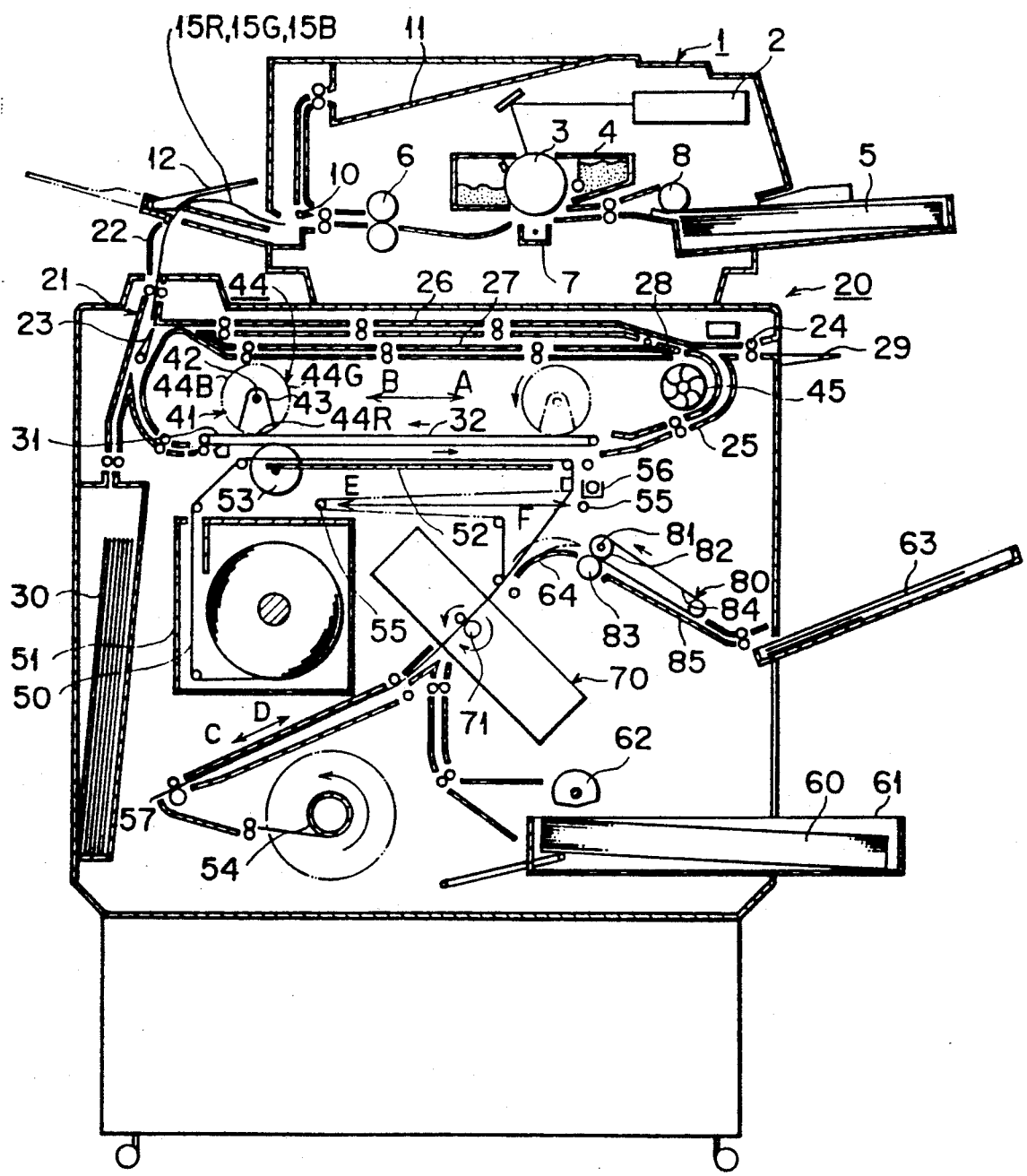
FIG. 1 is a vertical cross-sectional view showing an image recording apparatus to which the present invention is applied.

Like or corresponding parts are denoted by like or corresponding reference characters through views.

The terms "upstream" and "downstream" used herein are employed with reference to the direction in which a mask member, a photosensitive recording medium, and a color developer sheet are normally fed in a color image recording apparatus.

FIG. 1 shows a color image recording apparatus 20 to which the present invention is applied A monochromatic laser beam printer 1 for producing mask members is coupled to the color image recording apparatus 20.

The laser beam printer 1 is placed on the top of the color image recording apparatus 20. The laser beam printer 1 has a polygon scanner 2 which applies a laser beam to an electrically charged cylindrical photosensitive member 3 to form an electrostatic latent image on its outer circumferential surface. The electrostatic latent image on the photosensitive member 3 is then developed into a visible toner image by a developing unit 4 disposed alongside of the photosensitive member 3. An image transfer unit 7 is positioned below the photosensitive member 3 for transferring the toner image from the photosensitive member 3 onto a sheet of plain paper or an OHP sheet.

A sheet cassette 5 storing a stack of sheets of plain paper or OHP sheets is detachably inserted in the casing of the laser beam printer 1 upstream of the image transfer unit 7. The sheets in the sheet cassette 5 are fed one by one between the photosensitive member 3 and the image transfer unit 7 by a sheet feed roller 8 positioned near the sheet cassette 5. An image fixing unit 6 having a pair of fixing rollers is disposed downstream of the photosensitive member 3, and a sheet path selector 10 is disposed downstream of the image fixing unit 6. A sheet discharge tray 11 is disposed on the upper panel of the laser beam printer 1, whereas another sheet discharge tray 12 is positioned outside of the laser beam printer 1 downstream of its output slot near the sheet path selector 10.

If a black-and-white image is to be reproduced, then the printed sheet from the image fixing unit 6 is discharged by the sheet path selector 10 onto the sheet discharge tray 11. If a colored image is to be reproduced, then the printed sheet from the image fixing unit 6 is first discharged onto the sheet discharge tray 12, and then fed into the color image recording apparatus 20. The distal end of the sheet discharge tray 12 is angularly movable between solid-line and chained-line positions in FIG. 1. When it is in the solid-line position, the printed sheet from the laser beam printer 1 is guided into the color image recording machine 20. A set of three monochromatically printed sheets from the laser beam printer 1 is used as a set of mask members 15R, 15G, 15B (also referred to collectively as a mask member or members 15) in the color image recording apparatus 20.

The monochromatic laser beam printer 1 records image data transmitted from a host computer (not shown) on sheets.

The construction of the color image recording apparatus 20 will be described below.

The color image recording apparatus 20 has a mask member feeder 21 disposed in an upper portion in an apparatus housing. The mask member feeder 21 comprises a positioning unit 31, a circulation guide 25, and two parallel upper and lower storage trays 26, 27, which are coupled in a circulatory pattern. The junction between the positioning unit 31 and the storage trays 26, 27 is connected to the discharge tray 12 of the monochromatic laser beam printer 1 through a guide member 22 disposed above the color image recording apparatus 20, so that a printed sheet (mask member) from the monochromatic laser beam printer 1 can be introduced into the mask member feeder 21. A cooling fan 45 for cooling the positioning unit 31 and associated parts is positioned immediately inwardly of the circulation guide 25.

The mask member feeder 21 includes a singable gate 23, positioned between the positioning unit 31 and the storage trays 26, 27, for directing a mask member 15, which has been guided by the guide member 22, toward the positioning unit 31 or a discharge tray 30 positioned in one lower side of the color image recording apparatus 20. A gate 28a is disposed between the circulation guide 25 and the storage trays 26, 27. The gate 28a directs a mask member 15, which has been guided by the circulation guide 25, into the upper storage tray 26 or the lower storage tray 27. A mask member 15 which has manually been inserted from a manual feed tray 29 disposed on an opposite upper side of the color image recording apparatus 20 can be introduced into the mask member feeder 21 through pair of rollers 24. Another gate 28b is disposed between the manual feed tray 29 and the storage trays 26, 27, for allowing the mask member 15 manually inserted from the manual feed tray 29 to be fed into the mask member feeder 21.

Figure 2:
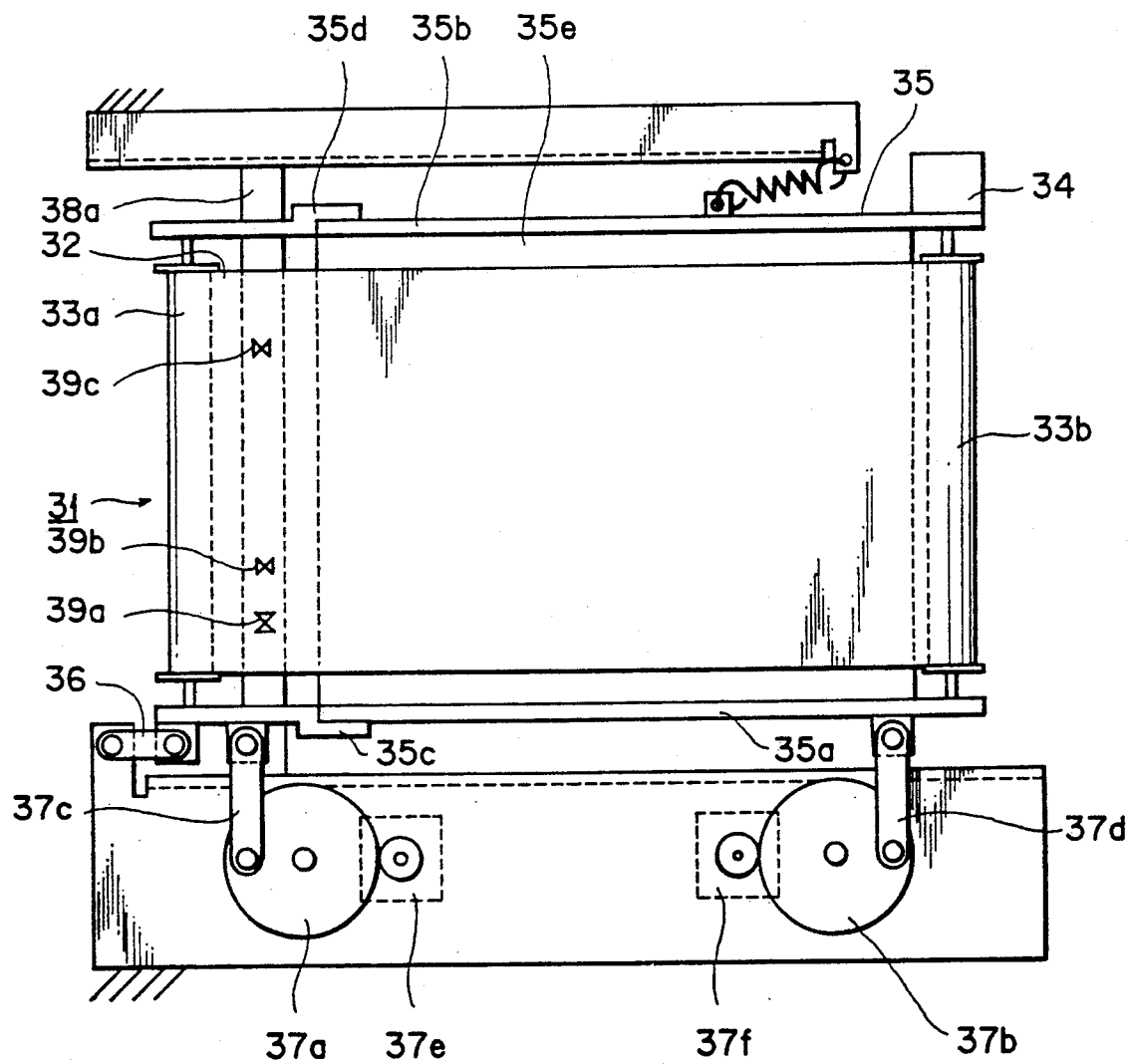
FIG. 2 is a plan view showing a mask member positioning unit.

As shown in FIG. 2, the positioning unit 31 comprises an endless feed belt 32 and a pair of belt rollers 33a, 33b around which the feed belt 32 is trained. The feed belt 32 is constructed of a web or film of a light-transmissive dielectric material such as PET (polyehylene terephthalate). An upstream belt roller 33a (on the lefthand side in FIG. 2) comprises a sleeve of electrically conductive rubber fitted over a metal shaft, whereas the downstream belt roller 33b (on the righthand side in FIG. 2) has a tubular outermost layer of rubber. The belt rollers 33a, 33b are rotatably supported at their opposite ends by a pair of parallel belt support frames which comprise a pair of main side frames 35a, 35b spaced from each other and a pair of auxiliary side frames 35c, 35d spaced from each other and detachably connected contiguously to the main side frames 35a, 35b. A flat contacting plate 35e made of a transparent acrylic resin, for example, is disposed between and fixed to the main side frames 35a, 35b.

A belt feed motor 34 has its output shaft connected to one end of the downstream belt roller 33b for rotating the belt roller about its own axis. When the belt feed motor 34 is energized, therefore, the feed belt 32 is driven in a circulating manner as indicated by the arrows in FIG. 1. The main side frame 35a and its associated auxiliary side frame 35c are operatively supported horizontally on an apparatus housing through a pair of belt support frame moving links 37c, 37d to which the links 37c, 37d are eccentrically coupled. The auxiliary side frame 35c is also operatively joined to the apparatus housing through another link 36. A pair of belt support frame moving motors 37e, 37f are mounted on the apparatus housing. The motors 37e, 37f have respective output shafts operatively connected to the disks 37a, 37b, respectively, through intermeshing gear teeth (not shown). Therefore, when the motors 37e, 37f are energized, the frames 35a, 35b are moved horizontally back and forth through the disks 37a, 37b and hence the feed belt 32 is controlled depending on the position of positioning or registering marks on the mask member 15. To the other main side frame 35b, there is coupled a spring engaging an apparatus housing. The spring serves to take up any lost motion or gear backlash between the frames 35a, 35b, the links 37c, 37d, the disks 37a, 37b, and the output shafts of the motors 37e, 37f, so that the feed belt 32 can be positioned highly accurately.

The surface of the feed belt 32 is electrically charged by a charging unit (not shown), such as corotron, for electrostatically attracting the mask member 15 to the surface of the feed belt 32.

In one side surface of the feed belt 32, a sensor support bar 38a is disposed whereas in another side surface thereof, another sensor support bar 38b is disposed. Mask positioning sensors are mounted on the sensor support bar 38a which read positioning marks printed on the mask member 15 and position the latter in a predetermined position. Mask identification sensors are further mounted on the sensor support bar 38a for identifying the kind of the mask member 15.

Figure 3A:
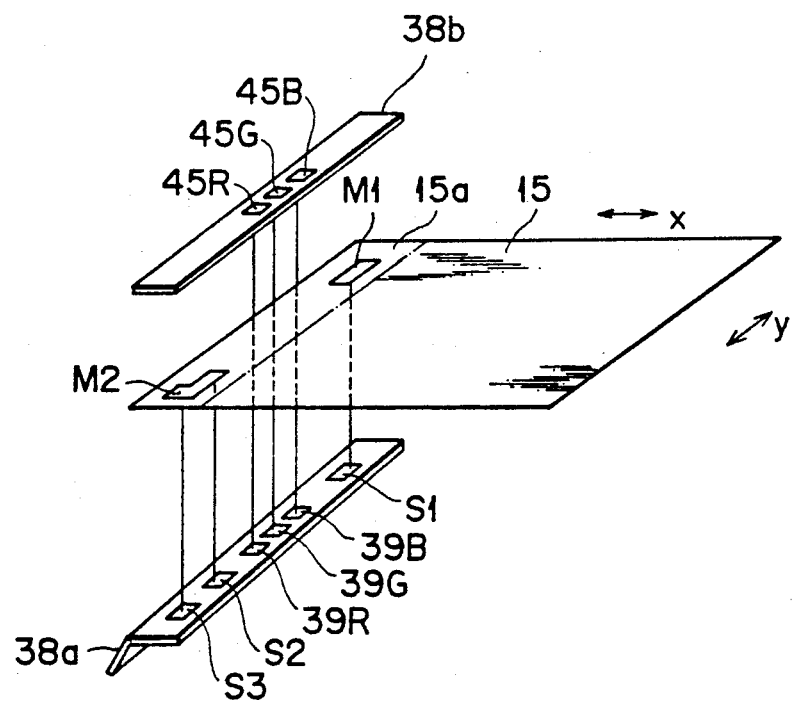
FIGS. 3A and 3B are perspective views showing sensor assemblies for sensing light transmission rates of a mask member.

FIG. 3A shows details of the positional relation between the sensor support bars 38a, 38b and the mask member 15. The mask member 15 has a non-image region 15a where marks M1 and M2 are printed. The mark M1 is used for detecting the X-directional position of the mask member 15 and the mark M2 is used for detecting both the X- and Y-directional positions of the mask member 15. In the lower sensor support bar 38a disposed underneath the mask member 15, there are provided X-directional position sensors S1, S2 and a Y-directional positioned sensor S3. The sensor S1 is disposed in a position corresponding to the mark M1 and the sensors S2 and S3 are disposed in positions corresponding to the mark M2. Each sensor is of a light reflection type comprising, for example, an LED and a photodiode. The marks are detected by those sensors based on differences in a light reflection amount between the mark portion and the background portion of the mask member 15.

In the lower sensor support bar 38a, there are further provided light emitting elements 39R, 39G and 39B for measuring the amounts of color separated light components transmitted through the mask member 15. The light emitting element 39R comprises a white lamp and a red filter. Similarly, the light emitting element 39G comprises a white lamp and a green filter, and the light emitting element 39B comprises a white lamp and a blue filter.

In the upper sensor support bar 38b disposed above the mask member 15, there are provided light receiving elements 45R, 45G and 45B in positions corresponding to the light emitting elements 39R, 39G and 39B, respectively. Photodiodes are employed, for example, as the light receiving elements.

As shown in FIG. 1, an exposure device 41 is disposed above the positioning unit 31. The exposure device 41 extends transversely across the positioning unit 31, i.e., in a direction normal to the sheet of FIG. 1, and is reciprocally movable horizontally along the positioning unit 31 as indicated by the arrows A, B.

Figure 4:
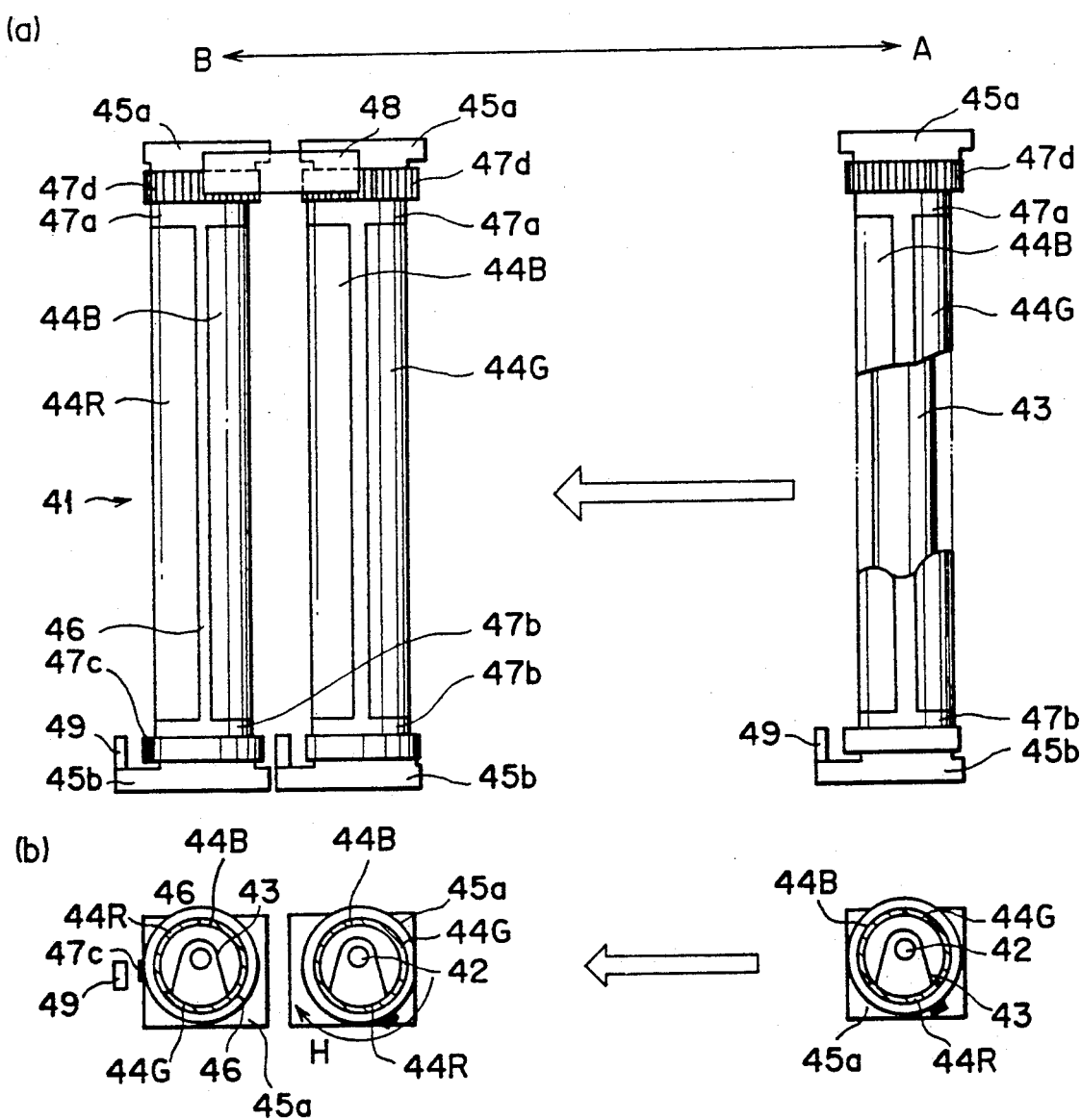
FIG. 4 includes a plan view and a cross sectional view showing an exposure unit.

More specifically, as shown in detail in FIG. 4, the exposure device 41 comprises a linear light source or lamp 42 for emitting white light, a reflecting member 43 disposed over and extending downwardly from the light source 42 for reflecting light from the light source 42 in downward direction, and a cylindrical color separation filter assembly 44 comprising three color separation filters 44R, 44G, 44B of red, green, blue disposed around the light source 42 and the reflecting member 43. The filter assembly 44 is supported on a cylindrical frame 46. Cylindrical supporting members 47a, 47b are provided in both ends of the frame 46 to be rotatable therewith and are supported by frames 45a, 45b to be rotatable with the frame 46. The frames 45a, 45b are joined together by a tie-plate (not shown) so that the exposure unit 41 can be integrally provided. A gear 47d is formed on the supporting member 47a. As the exposure unit 41 reciprocates back and forth in the directions indicated by arrows A and B, a predetermined area on the photosensitive recording medium is exposed to light. The supporting member 47a includes one-way clutch and the gear 47d meshingly engages a rack 48. When the exposure unit 41 moves in the direction B, the gear 47d rotates in the direction H, whereby the replacement of the color separation filters is carried out.

In the supporting member 47a, there is provided a mark 47c indicating a reference position of the filter assembly 44, and in the position confronting the mark 47c, a sensor 49 is disposed for sensing the mark 47c. The filter being used can be identified by the number of times that the sensor 49 senses the mark 47c.

A flat exposure table 52 which lies horizontally is disposed beneath the positioning unit 31. The flat exposure table 52 can be moved upwardly and downwardly by a cam 53 which is actuatable by an actuator (not shown).

A photosensitive recording medium or sheet 50 is primarily made of photosetting resins including a photopolymerization initiator known from Japanese Laid-Open Patent Publication No. 62(1987)-143044, for example. More specifically, the photosensitive recording medium 50 comprises a base sheet coated with photosetting resins which will be set upon exposure to lights having wavelengths of red, green, and blue, and microcapsules containing dye precursors of cyan, magenta, and yellow. The photosensitive recording medium 50 is housed in the form of a roll in a cartridge 51 in a light-shielded condition, the cartridge 51 being disposed below and upstream of the positioning unit 31. A pressure developing unit 70 having a pair of pressure rollers 71 is positioned below the exposure table 52. Between the exposure table 52 and the pressure developing unit 70, there are disposed a fastening roller 56 for gripping the photosensitive recording medium 50 while an image thereon is being developed by the pressure developing unit 70, a tension roller 55 for tensioning the photosensitive recording medium 50 to remove a sag therefrom while an image thereon is being developed by the pressure developing unit 70, and a movable guide 64. A takeup roller 54 for winding up the photosensitive recording medium 50 is located below the pressure developing unit 70. A drive roller 57 (or feeding the photosensitive recording medium 50 at a constant speed is positioned between the pressure developing unit 70 and the takeup roller 54 along the path of the photosensitive recording medium 50. The photosensitive recording medium 50 which is drawn out of the cartridge 51 passes between the feed belt 32 and exposure table 52, goes past the fastening roller 56, the tension roller 55, the movable guide 64, the pressure developing unit 70, and the drive roller 57, and is wound around the takeup roller 54.

A color developer sheet 60 comprises a base sheet coated with a color developer disclosed in Japanese Laid-Open Patent Publication No. 58(1983)-88739, for example. A stack of such color developer sheets 60 is stored in a cassette 61 with their coated surfaces face down, the cassette 61 being disposed in a lower portion of the color image recording apparatus 20. The color developer sheets 60 are fed, one by one, from the cassette 61 by a feed roller 62 which is intermittently operated by an actuator (not shown), and supplied to the pressure developing unit 70. The supplied color developer sheet 60 is placed over the exposed area of the photosensitive recording medium 50, and pressed thereagainst by the pressure rollers 71 in the pressure developing unit 70, whereupon a latent image which has been formed on the photosensitive recording medium 50 by exposure to light from the exposure device 41 is visualized on the color developer sheet 60.

A thermal fixing unit 80 which is positioned upwardly of the cassette 61 comprises a heat roller 82 with a heater 81 disposed therein, an auxiliary roller 85, an endless belt 84 trained around the heat roller 82 and the auxiliary roller 85, and a pinch roller 83 pressed against the heat roller 82 through the endless belt 84 therebetween. The color developer sheet 60 which has fed from the pressure developing unit 70 and guided by the movable guide 64 is introduced into the thermal fixing unit 80 in which the color developer sheet 60 is calendered to fix the visualized image. The color developer sheet 60 is then discharged from the thermal fixing unit 80 onto a discharge tray 63 disposed downstream of the thermal fixing unit 80 and positioned outside of the housing of color image recording apparatus 20 below the manual feed tray 29.

The color image recording apparatus 20 thus constructed operates as follows:

It is assumed that a red mask member 15R produced by the monochromatic laser beam printer 15. More specifically, an electrostatic latent image is formed on the surface of the photosensitive member 3 by the polygon scanner 2 based on desired data to be recorded or printed, and then toner particles are applied to the latent image by the developing unit 4, thus visualizing the latent image into a toner image as a light-shielding image. A sheet is fed from the cassette 5 toward the photosensitive member 3 by the feed roller 8, and the light-shielding toner image on the photosensitive member 3 is transferred onto the sheet from the cassette 5 by the image transfer unit 7. Then, the sheet is fed to the image fixing unit 6 in which the toner image is thermally fixed to the sheet by fixing rollers. The sheet is thereafter discharged as the red mask member 15R onto the discharge tray 12 by the sheet path selector 10. The red mask member 15R thus produced carries the light-shielding toner image except which light can pass through the red mask member 15R to photoset those microcapsules which contain a dye precursor of cyan on the photosensitive recording medium 50.

At this time, the discharge tray 12 of the monochromatic laser beam printer 1 is in the solid-line position. The produced mask member 15R is guided by the guide member 22 into the mask member feeder 21 in the color image recording apparatus 20.

If it is confirmed by the sensors 33a, 33b, 33c, in the positioning unit 31 that there is no other mask member present in the positioning unit 31, then the mask member 15R is guided by the gate 23 so that it is fed into the positioning unit 31.

The positioning unit 31 then electrostatically attracts the mask member 15R on the belt 32 and conveys the mask member 15R to an exposure position. While reading the positioning marks M1 and M2 printed on the mask member 15R by the sensors S1, S2 and S3 disposed in the sensor support bar 38a, the positioning unit 31 is moved toward X- and/or Y-direction indicated in FIG. 3A by the belt feed motor 34 and the belt unit moving motors 37e, 37f, whereby the positioning unit 31 is accurately positioned.

Figure 5:
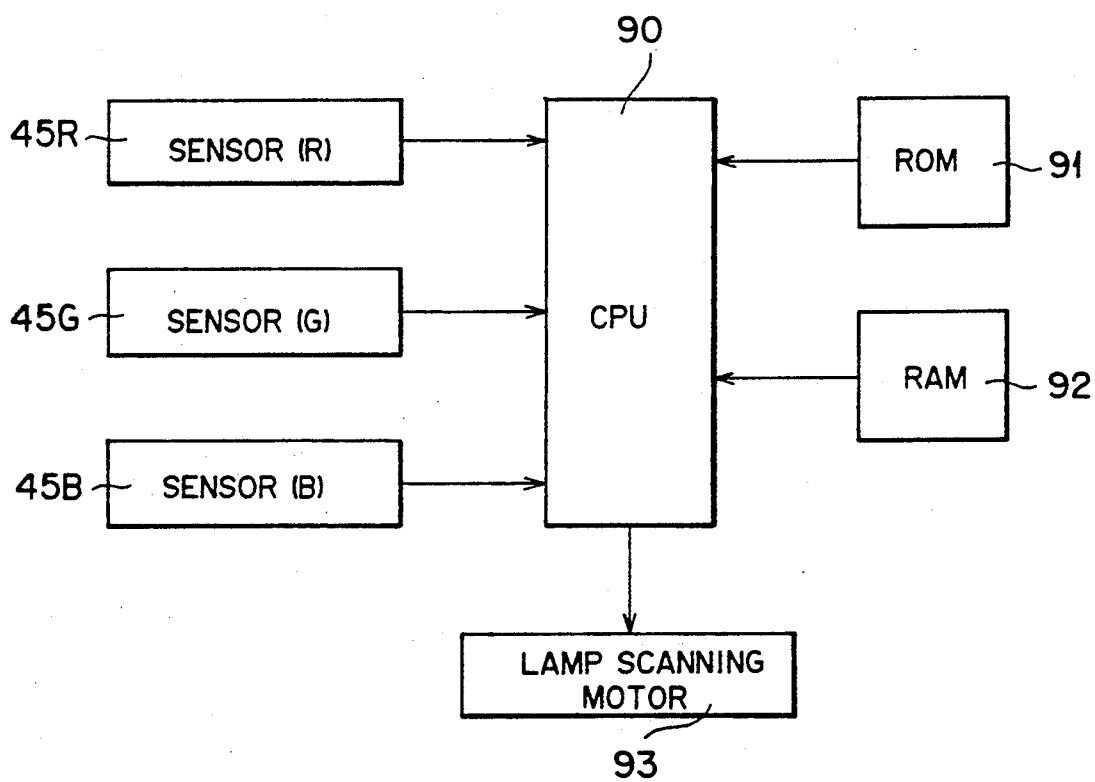
FIG. 5 is a block diagram showing an electrical arrangement of a control means.

In association with the positioning operation, a transmission amount of red light transmitted through the mask member 15R is detected by the sensors 39R, 45R disposed in the sensor support bars 38a, 38b. A hardware arrangement of a light amount control system is shown in FIG. 5 in block form. As shown therein, a control system is constructed essentially of a microcomputer including a central processing unit (CPU) 90, read-only memory (ROM) 91, and a random access memory (RAM) 92. In the CPU 90, the output of the sensor 45R is compared with a preset red light amount data D1. When the transmission amount N1 of the red light is in coincidence with the preset data D1, the scanning speed of the lamp 42 is set to a predetermined standard speed. On the other hand, when the transmission amount N1 is smaller than the preset data D1, the scanning speed of the lamp 42 is set to a speed slower by a predetermined value than the standard speed. When the transmission amount N1 is larger than the preset data D1, then the scanning speed of the lamp 42 is set to a speed faster by a predetermined value than the standard speed. In this manner, the scanning speed of the lamp 42 is determined.

Then, the photosensitive recording medium 50 is gripped and fastened by the fastening roller 56, and the cam 53 is rotated by an actuator (not shown) to elevate the exposure table 52. The photosensitive recording medium 50 is now held intimately against the feed belt 31 of the positioning unit 31 with the mask member 15R sandwiched therebetween.

When the photosensitive recording medium 50 is in close contact with the feed belt 32, the lamp 42 is turned on, and red light is applied from the red filter 44R through the mask member 15R to the photosensitive recording medium 50 while at the same time it is being scanned by the exposure device 41 in the direction indicated by the arrow A. The light from the lamp 42 passes through the red filter 44R and is applied through the mask member 15R to the photosensitive recording medium 50 to expose the same, thus forming a latent image corresponding to the red mask member 15R on the photosensitive recording medium 50. After the exposure, the lamp 42 is de-energized, and the exposure device 41 moves back in the direction indicated by the arrow B. When the exposure device 41 moves back, the color separation filter assembly 44 is rotated by an actuator (not shown) to position the next green filter 44G below the lamp 42. While the exposure device 41 is moving back, the exposure table 52 is lowered by the cam 53 so that the photosensitive recording medium 50 is spaced downwardly from the positioning unit 31 and the mask member 15R.

At this time, the photosensitive recording medium 50 is held under back tension by the shaft in its roll in the cartridge 51. When the exposure table 52 is lifted, the length of the photosensitive recording medium 50 which corresponds to the upward displacement of the exposure table 52 is drawn out of the cartridge 51. When the exposure table 52 is lowered after exposure, the length of the photosensitive recording medium 50 which corresponds to the downward displacement of the exposure table 52 is withdrawn into the cartridge 51, thereby taking up any sag in the photosensitive recording medium 50.

After the exposure using the red mask member 15R is completed and the descent of the exposure gable 52 is confirmed, the feed belt 32 of the positioning unit 31 is moved to deliver the mask member 15R into the circulation guide 25, from which the red mask member 15R is guided by the gate 28 into the upper storage tray 26.

Then, the green mask member 15G generated by the monochromatic laser beam printer 1 passes through the guide 22, and is guided by the gate 23 into the positioning unit 31 in which the green mask member 15G is electrostatically attracted to the lower surface of the feed belt 32, fed to the exposure position, and positioned with respect to the photosensitive recording medium 50. At this time, similar to the mask member 15R, a transmission rate of green color component transmitting through the mask member 15G is detected by the sensor 45. A transmission amount of the green color component light is compared with a reference data D2 indicative of a standard amount of light for the green color light component. Based on the comparison results, the scanning speed of the lamp 42 is determined.

The photosensitive recording medium 50 is fastened by the fastening roller 56, and the exposure table 52 is elevated to hold the photosensitive recording medium 50 and the green mask member 15G closely against the feed belt 32, after which the lamp 42 is energized to expose the photosensitive recording medium 50 to green light from the green filter 44G, thus forming a latent image corresponding to the green mask member 15G on the photosensitive recording medium 50.

Then, the color separation filter assembly 44 is rotated to bring the blue filter 44B below the lamp 42. The blue mask member 15B generated by the monochromatic laser beam printer 1 is then delivered by the mask member feeder 21 and positioned by the positioning unit 31. In the similar fashion as described above, the scanning speed of the lamp 42 is determined based on the output of the sensor 45B. Thereafter, the photosensitive recording medium 50 is exposed to blue light by the exposure device 41, thereby forming a latent image corresponding to the blue mask member 15B on the photosensitive recording medium 50. Through the above process, a desired colored latent image is formed on the photosensitive recording medium 50.

Then, the exposure table 52 is lowered and the fastening roller 56 is released from the photosensitive recording medium 50, which is then fed by the drive roller 57 in the direction indicated by the arrow C. At this time, the tension roller 55 and the movable guide 64 are in the solidline position. The pressure rollers 71 of the pressure developing unit 70 are spaced from each other. Therefore, while the photosensitive recording medium 50 is being fed and wound up by the takeup roller 54, the microcapsules on the photosensitive recording medium 50 are not damaged or ruptured by contact with these components. The drive roller 57 is stopped when the trailing end of the latent image on the photosensitive recording medium 50 arrives at the pressure rollers 71 of the pressure developing unit 70.

In synchronism with the winding of the photosensitive recording medium 50, a color developer sheet 60 is delivered from the cassette 61 by the sheet feet roller 62. The color developer sheet 60 from the cassette 61 is stopped when its leading edge faces the trailing end of the latent image on the photosensitive recording medium 50.

The pressure rollers 71 of the pressure developing unit 70 are then rotated and held against each other by an actuator (not shown), and the photosensitive recording medium 50 is gripped and fastened by the fastening roller 56. The photosensitive recording medium 50 and the color developer sheet 60 which are held in superposed relation to each other are pressed and fed in the direction indicated by the arrow D. At this time, those microcapsules which are not photoset on the photosensitive recording medium 50 are ruptured under pressure, and a colored visible image corresponding to the latent image on the photosensitive recording medium 50 is developed on the color developer sheet 60.

As the pressure rollers 71 rotate in the directions indicated by the arrows, the tension roller 50 is moved in the direction indicated by the arrow E, taking up any sag in the photosensitive recording medium 50. While the tension roller 55 moves in the direction indicated by the arrow E, the movable guide 64 is moved by a mechanism (not shown) into the chained-line position to separate the leading edge of the color developer sheet 60 from the photosensitive recording medium 50, and guide the color developer sheet 60 toward the thermal fixing unit 80.

In the thermal fixing unit 80, the color developer sheet inserted between the heat roller 82 which is heated by the heater 81 and the pinch roller 83, and heat energy is applied to the color developer sheet 60 by the heater 81 through the rotating heat roller 82 and the endless belt 84 to promote color development of the colored image. At the same time, binder polymer by which the color developers are fixed to the base sheet of the color developer sheet 60 is thermally fused on the color developer sheet 60 for thereby securing the color developers to the base sheet. The color developer sheet 60 is now calendered to the same smoothness as that of the surface of the endless belt 84, so that the color developer sheet 60 has a suitable glossy surface.

After the color developing and calendering process, the color developer sheet 60 is separated from the endless belt 84, and discharged onto the discharge tray 63.

During the image developing process and the color developing and calendering process described above, the photosensitive recording medium 50 is gripped and fastened in place by the fastening roller 56. Therefore, the portion of the photosensitive recording medium 50 which is placed on and upstream of the exposure table 52 is not affected by changes in the tension of the photosensitive recording medium 50 downstream of the exposure table 52. Consequently, while one image on the photosensitive recording medium 50 is being developed, the photosensitive recoding medium on the exposure table 52 may be exposed to light to form another colored latent image thereon.

When it is desired to reproduce a plurality of colored images from the same set of mask members 15, the gate 23 in the mask member feeder 21 is angularly shifted to guide the mask member 15R stored in the storage tray 26 into the positioning unit 31 again, and the photosensitive recording medium 50 is exposed to light through the mask member 15R. The mask members 15G, 15B, are similarly guided from the storage trays 26, 27 successively into the positioning unit 31 as soon as the exposure cycle using the previous mask member 15 is finished. The mask member feeder 21 can thus repeatedly circulate the mask members 15 as many times as desired.

After a desired number of colored images have been reproduced from the same set of mask members 15, the gate 23 is further angularly shifted to discharge the mask members 15 from the mask member feeder 21 into the discharge tray 30.

If a mask member 15 of a next set happens to be fed from the monochromatic laser beam printer 1 while a series of colored images are being reproduced in the color image recording apparatus 20, then the gate 23 is angularly moved for thereby guiding the mask member 15 from the monochromatic laser beam printer 1 into the discharge tray 30.

As described above, the mask member feeder 21 is associated with the manual feed tray 29 for allowing a mask member 15, which has been produced by another means, to be manually introduced into the color image recording apparatus 20. The manual feed gate 28b serves to prevent a mask member from being manually inserted in the event that there has already been another mask member in the mask member feeder 21.

Figure 3B:
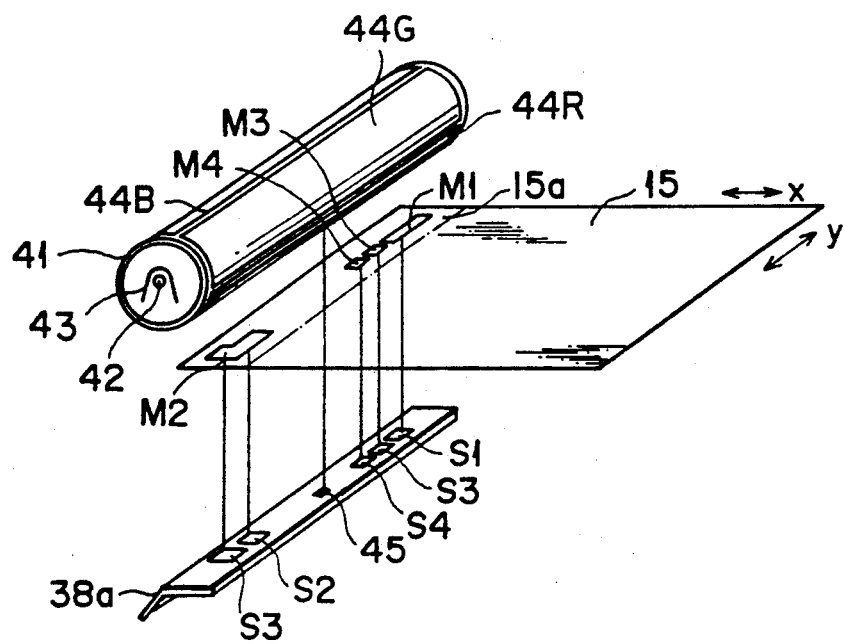

Another embodiment of the present invention will be described with reference to FIG. 3B. In FIG. 3B, the marks M1 and M2 are used to detect the X- and Y-directional positions of the mask member 15 as described. Marks M3 and M4 are used to identify the three kinds of mask members 15. In the sensor support bar 38a, sensors S3 and S4 are disposed in positions corresponding to the marks M3 and M4, respectively. In this embodiment, a single sensor 45 is disposed on the sensor support bar 38a for receiving red, green and blue color light components which are emitted from the exposure unit 41 by switching the red, green and blue filters 44R, 44G and 44B. In this embodiment, the output of the sensor 45 is applied to the CPU 90 shown in FIG. 5 and the above-described processing is implemented therein.

Based on the amount of light received at the sensor 45, the conveying speed of the exposure unit 41 is controlled as described above.

While the present invention has been described with reference to specific embodiments, it would be apparent for those skilled in the art that a variety of changes and modifications may be made without departing from the scope and spirit of the invention. For example, the amount of light applied to the photosensitive recording medium through the mask member can be varied by varying the amount of light emitted from the lamp 42 while moving the exposure unit 41 at a predetermined constant speed.

What is claimed is:

1. An image recording apparatus for recording an image of an original document on a sheet of paper using a photosensitive recording medium and a plurality of mask members, each of the plurality of mask members having a light shielding image corresponding to a color-separated image of the original document and a non-image region disposed at one end of each mask member, comprising:

exposure means for exposing the photosensitive recording medium to light to form a latent image thereon, wherein the mask member is superposed on the photosensitive recording medium for exposing the photosensitive recording medium to a color-separated light component corresponding to the color-separated image formed on the mask member through the mask member;

detecting means for detecting a transmission rate of the color-separated light component transmitting through the mask member and producing a detection output, said detecting means being positioned at a position corresponding to the non-image region of each mask member;

control means responsive to the detection output for controlling an amount of the color-separated light component applied through the mask member to the photosensitive recording medium; and wherein said detection means comprises light emitting means disposed on one side of the mask member for emitting the color-separated light component, and light receiving means disposed on another side of the mask member for receiving the color-separated light component emitted from said light emitting means and transmitted through the mask member, said light receiving means producing the detection output indicative to an amount of light received thereat.

2. An image recording apparatus according to claim 1, wherein said exposure means is movably disposed to be movable at a speed relative to the photosensitive recording member on which the mask member is superposed, and wherein the speed of said exposure means varies in response to the detection output.

3. An image recording apparatus according to claim 2, wherein said control means comprises memory means storing therein reference amount of light, and processing means for comparing the amount of light received at said light receiving means with the reference amount of light, the speed of the exposure means being varied depending upon a comparison result.

4. An image recording apparatus according to claim 3, further comprising developing means for developing the latent image formed on the photosensitive recording medium and forming a visible image on the sheet of paper, and fixing means for thermally fixing the visible image formed on the sheet of paper.

5. An image recording apparatus according to claim 1, wherein said exposure means is movably disposed to be movable at a constant speed relative to the photosensitive recording member on which the mask member is superposed, and wherein an amount of light emitted from said exposure means varies in response to the detection output.

6. An image recording apparatus according to claim 5, wherein said control means comprises memory means storing therein reference amount of light, and processing means for comparing the amount of light received at said light receiving means with the reference amount of light, the amount of light emitted from said exposure means is varied depending upon a comparison result.

7. An image recording apparatus according to claim 6, further comprising developing means for developing the latent image formed on the photosensitive recording medium and forming a visible image on the sheet of paper, and fixing means for thermally fixing the visible image formed the sheet of paper.

8. An image recording apparatus for recording an image of an original document on a sheet of paper using a photosensitive recording medium and a plurality of mask members, each of the plurality of mask members having a light shielding image corresponding to a color-separated image of the original document and a non-image region disposed at one end of each mark member comprising:

exposure means for exposing the photosensitive recording medium to light to form a latent image thereon, wherein the mask member is superposed on the photosensitive recording medium for exposing the photosensitive recording medium to a color-separated light component corresponding to the color-separated image formed on the mask member through the mask member;

detecting means for detecting a transmission rate of the color-separated light component transmitting through the mask member and producing a detection output, said detecting means being positioned at a position corresponding to the non-image region of each mask member; and wherein said detection means comprises light receiving means disposed to receive a color-separated light component emitted from said exposure means and transmitted through the mask member, said light receiving means producing the detection output indicative of an amount of light received thereat.

9. An image recording apparatus according to claim 8, wherein said exposure means is movably disposed to be movable at a speed relative to the photosensitive recording member on which the mask member is superposed, and wherein the speed of said exposure means varies in response to the detection output.

10. An image recording apparatus according to claim 9, wherein said control means comprises memory means storing therein reference amount of light, and processing means for comparing the amount of light received at said light receiving means with the reference amount of light, the speed of the exposure means is varied depending upon a comparison result.

11. An image recording apparatus according to claim 10, further comprising developing means for developing the latent image formed on the photosensitive recording medium and forming a visible image on the sheet of paper, and fixing means for thermally fixing the visible image formed on the sheet of paper.

12. An image recording apparatus according to claim 11, wherein said exposure means is movably disposed to be movable at a constant speed relative to the photosensitive recording member on which the mask member is superposed, and wherein an amount of light emitted from said exposure means varies in response to the detection output.

13. An image recording apparatus according to claim 12, wherein said control means comprises memory means storing therein reference amount of light, and processing means for comparing the amount of light received at said light receiving means with the reference amount of light, the amount of light emitted from said exposure means is varied depending upon a comparison result.

14. An image recording apparatus according to claim 13, further comprising developing means for developing the latent image formed on the photosensitive recording medium and forming a visible image on the sheet of paper, and fixing means for thermally fixing the visible image formed on the sheet of paper.

* * * * *